(12) United States Patent
Bailey et al.

(10) Patent No.: US 9,730,355 B2
(45) Date of Patent: Aug. 8, 2017

(54) PROVISIONING OF LIGHTWEIGHT CONFIGURABLE SERVERS WITH CHASSIS BASE AND COVER DESIGNED FOR NESTED STACKING

(71) Applicant: DELL PRODUCTS, L.P., Round Rock, TX (US)

(72) Inventors: Edmond I. Bailey, Cedar Park, TX (US); Walter Carver, Round Rock, TX (US)

(73) Assignee: Dell Products, L.P., Round Rock, TX (US)

( * ) Notice: Subject to any disclaimer, the term of this patent is extended or adjusted under 35 U.S.C. 154(b) by 453 days.

(21) Appl. No.: 14/302,347

(22) Filed: Jun. 11, 2014

(65) Prior Publication Data
US 2015/0366096 A1 Dec. 17, 2015

(51) Int. Cl.
*H05K 5/02* (2006.01)
*H05K 7/14* (2006.01)
*H05K 9/00* (2006.01)

(52) U.S. Cl.
CPC ......... *H05K 7/1487* (2013.01); *H05K 9/0079* (2013.01); *Y10T 29/49004* (2015.01); *Y10T 29/4914* (2015.01)

(58) Field of Classification Search
CPC ...... H05K 5/03; H05K 5/0043; H05K 5/0047; H05K 5/0056; H05K 5/006; H05K 5/0073; H05K 5/0204; H05K 5/0217; H05K 5/0221; H05K 5/0239; H05K 5/02; H05K 7/1488; H05K 7/023; H05K 7/14; H05K 7/1461; H05K 7/1474; H05K 7/1487; H05K 7/1489; H05K 9/0079; H05K 13/0023
See application file for complete search history.

(56) References Cited

U.S. PATENT DOCUMENTS

| | | | | | |
|---|---|---|---|---|---|
| 5,553,824 | A | * | 9/1996 | Dutra, Jr. | G06F 1/1632 108/93 |
| 7,035,111 | B1 | * | 4/2006 | Lin | G06F 1/18 361/748 |
| 7,778,020 | B2 | * | 8/2010 | Flynn | G06F 1/183 312/223.1 |
| 7,993,071 | B2 | * | 8/2011 | Clawson | A61M 16/1045 277/641 |
| 9,367,106 | B2 | * | 6/2016 | Alshinnawi | G06F 1/183 |
| 2013/0279109 | A1 | * | 10/2013 | Lindblad | G06F 1/1607 361/679.43 |

* cited by examiner

*Primary Examiner* — Courtney Smith
*Assistant Examiner* — Christopher L Augustin
(74) *Attorney, Agent, or Firm* — Isidore PLLC

(57) ABSTRACT

An information handling system (IHS) has a lightweight server (LWS) chassis that is user selectable from multiple LWS chassis. Each LWS chassis includes a chassis base having structural configuration that enables placement of the LWS chassis in a nested, stacked configuration with a second LWS chassis placed atop the LWS chassis and a third LWS chassis placed below the LWS chassis. Multiple LWS chassis can be stacked in a vertical space whose height is less than a sum of individual heights of each of the multiple LWS chassis. The IHS further includes compute components inserted into the LWS chassis and one or more connecting cabling interconnecting the at least two compute components.

6 Claims, 12 Drawing Sheets

PROVISIONING OF LIGHTWEIGHT CONFIGURABLE SERVERS WITH CHASSIS BASE AND COVER DESIGNED FOR NESTED STACKING

BACKGROUND

1. Technical Field

This disclosure generally relates to information handling systems (IHS), and more particular to a server chassis supporting nested stacking for shipping.

2. Description of the Related Art

As the value and use of information continue to increase, individuals and businesses seek additional ways to process and store information. One option available to users is information handling systems (IHSs). An IHS generally processes, compiles, stores, and/or communicates information or data for business, personal, or other purposes, thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

A rack-based IHS includes a rack having mounting features for installing information technology (IT) gear. Support and protection for the IT gear is provided by server chassis that can be inserted and removed from the rack. Generally the server chassis are manufactured in a different location from the where the IT gear is assembled and interconnected by cabling within each server chassis. Thus, multiple server chassis are shipped to an assembly location at an original equipment manufacturer (OEM) and then the assembled server is. packaged and shipped to the end customer's data center at considerable cost. End customers of these large scale server systems often desire customization of their systems would welcome a reduction in the shipping costs associated with acquiring these customized servers.

BRIEF SUMMARY

The illustrative embodiments of the present disclosure provide with a lightweight server (LWS) chassis that is user selectable from multiple LWS chassis. Each LWS chassis includes a chassis base having structural configuration that enables placement of the LWS chassis in a nested, stacked configuration with a second LWS chassis that is place atop the LWS chassis and a third LWS chassis that is placed below the LWS chassis. Multiple LWS chassis can be stacked in a vertical space whose height is less than a sum of individual heights of each of the multiple LWS chassis.

In one embodiment, a chassis cover is also designed with flared ends to allow the chassis cover to be inverted and nested with other chassis covers. In an additional embodiment, the chassis cover contains indentations representing an inverted configuration of the protruding IT gear that is inserted within an assembled LWS chassis. Prior to shipping of the server, the chassis cover is inverted and placed atop the protruding IT gear to provide secure containment of the IT gear and prevent dislodging of the IT gear from within the chassis.

According to at least one aspect of the present disclosure, an IHS is provided that includes the LWS chassis. The IHS further includes at least two compute components that are inserted into the LWS chassis and one or more connecting cabling interconnecting the at least two compute components.

According to at least one aspect of the present disclosure, a method is provided of shipping and downstream assembly of an IHS using an LWS chassis that ships in a reduced volume. The method includes manufacturing a chassis base of the LWS chassis having structural configuration that enables placement of the LWS chassis in a nested, stacked configuration with a second LWS chassis place atop the LWS chassis and a third LWS chassis placed below the LWS chassis, wherein multiple LWS chassis can be stacked in a vertical space whose height is less than a sum of individual heights of each of the multiple LWS chassis.

According to at least one aspect of the present disclosure, a method for shipping and downstream assembly of an IHS. In one embodiment, the method includes forming a LWS chassis having a chassis base and a chassis surface that receives compute component for downstream assembly of a fully functional IHS. the method includes forming a chassis cover having edges that are shaped in a first position to form an enclosure with the chassis base to protect the end user selectable compute components. the chassis cover is shaped in a second position that is flipped over from the first position to be positioned in the casing above the compute components. The method includes positioning a contoured shape of the chassis cover in the second position to opposingly contact, with the LWS chassis, an inserted modular, functional compute component to retain the inserted modular, functional compute component to prevent dislodging of the compute component if the LWS chassis is impacted. The method includes positioning the contoured shape of the chassis cover in the first position to define an air flow passage around the user selected compute components inserted into the chassis base.

The above presents a general summary of several aspects of the disclosure in order to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements.

Embodiments incorporating teachings of the present disclosure are shown and described with respect to the figures presented herein, in which.

DETAILED DESCRIPTION

Figure 1:
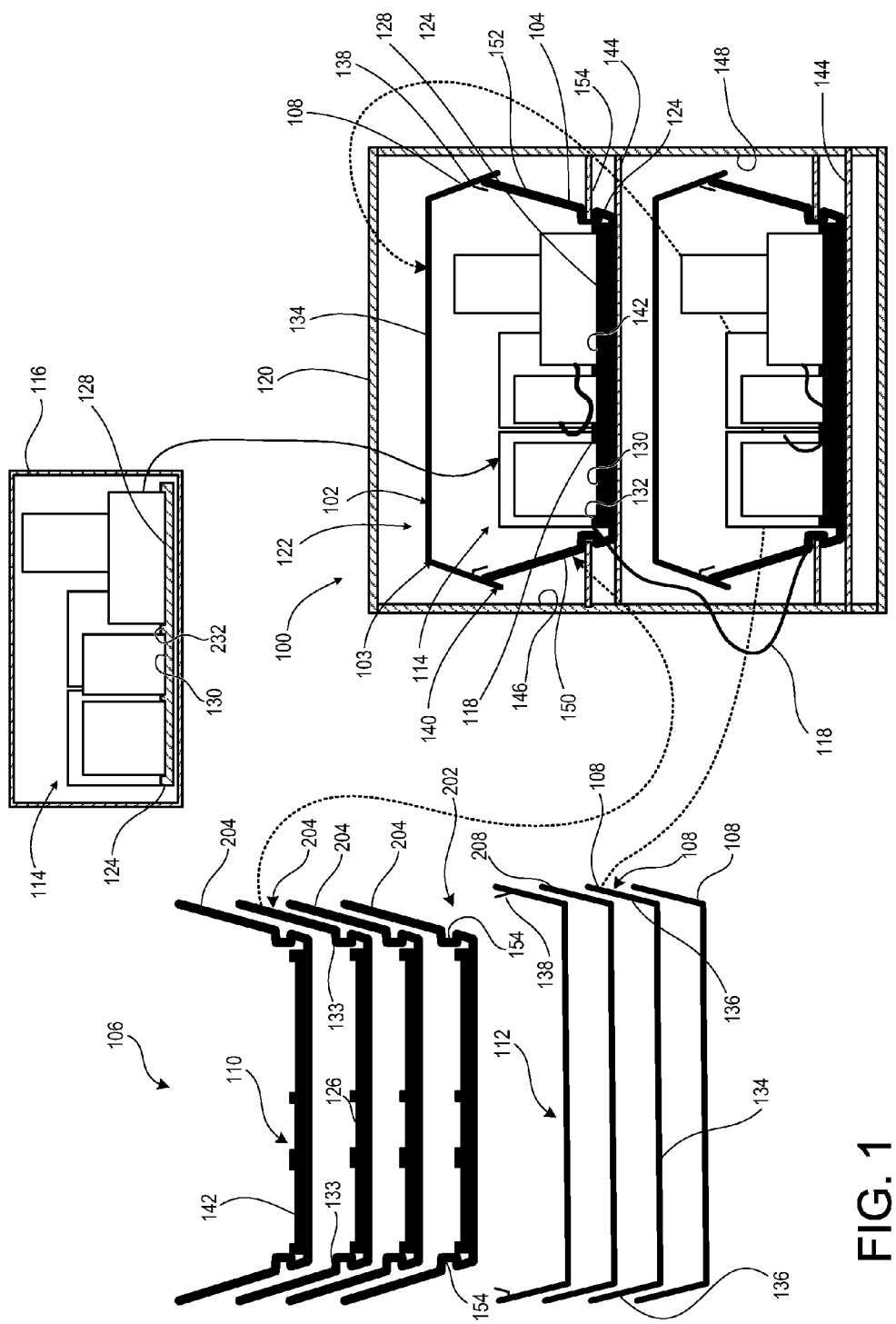
FIG. 1 illustrates a conceptual diagram of an information handling system (IHS) assembled from functional compute components inserted into a lightweight server (LWS) chassis that can be shipped as a nested stack, according to one embodiment.

The present disclosure provides an information handling system (IHS) that has a lightweight server (LWS) chassis that is user selectable from multiple LWS chassis. Each LWS chassis includes a chassis base having structural configuration that enables placement of the LWS chassis in a nested, stacked configuration with a second LWS chassis place atop the LWS chassis and a third LWS chassis placed below the LWS chassis. Multiple LWS chassis can be stacked in a vertical space whose height is less than a sum of individual heights of each of the multiple LWS chassis. The IHS further includes compute components inserted into the LWS chassis and one or more connecting cabling interconnecting the at least two compute components.

In one embodiment, a method is provided for shipping and downstream assembly of an IHS. The method includes forming a LWS chassis having a chassis base and a chassis surface that receives compute component for downstream assembly of a fully functional IHS. The method further includes forming a chassis cover having edges that are shaped in a first position to form an enclosure with the chassis base to protect the end user selectable compute components and that is shaped in a second position that is flipped over from the first position to be positioned in the casing above the compute components. The method includes positioning a contoured shape of the chassis cover in the second position to opposingly contact, with the LWS chassis, an inserted modular, functional compute component to retain the inserted modular, functional compute component to prevent dislodging of the compute component if the LWS chassis is impacted. the method further includes positioning the contoured shape of the chassis cover in the first position to define an air flow passage around the user selected compute components inserted into the chassis base.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

FIG. 1 illustrates a block diagram representation of an example IHS 100 having a lightweight server (LWS) chassis 102, which represents one of a plurality of various embodiments of the disclosure. For purposes of this disclosure, an information handling system, such as IHS 100, may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a handheld device, personal computer, a server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Each LWS chassis 102 has a chassis base 104 having structural configuration that enables placement of the LWS chassis 102 in a nested, stacked configuration 106. The LWS chassis 102 can be shipped economically in a reduced volume and in a more mutually protective arrangement. For example, the LWS chassis 102 can be positioned in the stacked configuration 106 with a second LWS chassis 102 place atop the LWS chassis 102 and a third LWS chassis 102 placed below the LWS chassis 102, such that multiple LWS chassis 102 can be stacked in a vertical space whose height is less than a sum of individual heights of each of the multiple LWS chassis 102. In one embodiment, a LWS chassis assembly 103 includes a chassis base 104 and a chassis cover 108. The stacked configuration 106 can include both a nested stack 110 of LWS chassis 102 and a nested stack 112 of chassis covers 108.

Compute components 114 are insertable into the LWS chassis 102. The LWS chassis base 104 is designed with indentations that allow for downstream provisioning and assembly of a fully functional IHS 100 using the LWS chassis 102 and end user selectable compute components 114. The compute components 114 can be packaged in a rectoid casing 116 for shipping to an end user destination for the assembly with individual ones of the nested, stacked LWS chassis 102 shipped to the same end user destination. For example, the IHS 100 can be made functional by electrically attaching interconnection cabling 118 inside of one LWS chassis 102 or between more than one LWS chassis 102. The IHS 100 may include one or more racks 120 for mounting the more than one assembled LWS chassis 102 configured with compute components 114 and interconnection cabling 118 to function as rack servers 122.

In one embodiment, the LWS chassis 102 includes at least one side panel 133 extending upwards from the base panel 126. Each side panel 133 can be flared obliquely to the base panel 126 to enable insertion of another chassis base 104 in a stacked, nested position during shipping.

Similarly with the LWS chassis 102, the chassis cover 108 can have a top panel 134 and at least one attached side panel 136 that is flared obliquely to the top panel 134. The chassis cover 108 can receive another chassis cover 108 in a stacked, nested position for shipping of multiple chassis covers 108 within a single shipping container. The LWS chassis 102 can include one or more connection affordances 138 to enable the chassis cover 108 to connect to the chassis base 104 to form an enclosure 140.

In one embodiment, the LWS chassis 102 can be formed from biodegradable material. Alternatively or in addition, the LWS chassis 102 can be made from or incorporate shielding material for shielding a user from electromagnetic interference (EMI) generated by the modular, functional compute components 114 and for shielding the modular functional compute components 114 from electrostatic damage. For clarity, the LWS chassis 102 is received within a bay 142 of the rack 120 defined and supported by a shelf 144. In other embodiments, internal lateral sides 146, 148 of the rack and external lateral sides 150, 152 of the LWS chassis 102 include engagement features 154 for mounting.

Figure 2:
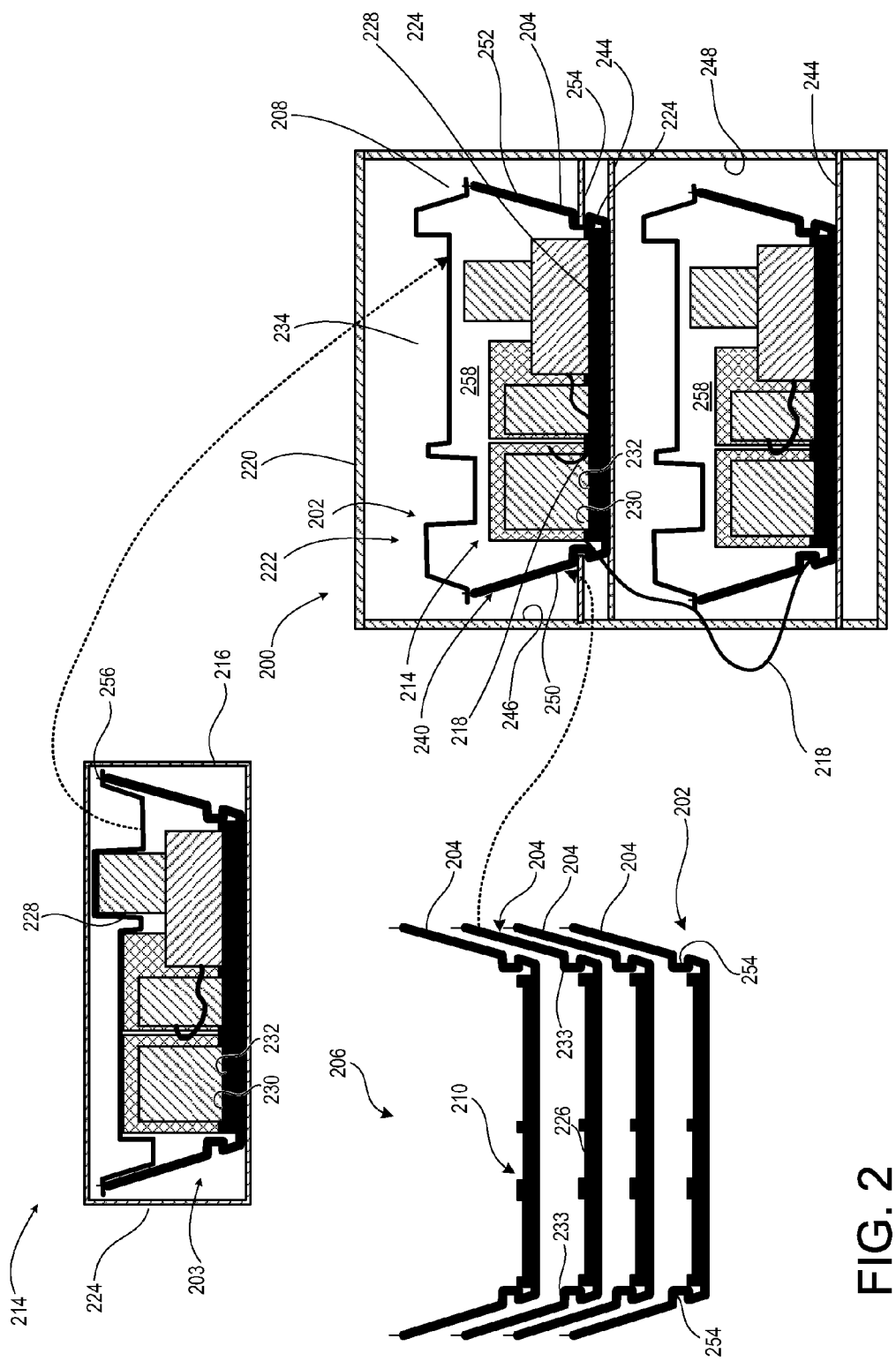
FIG. 2 illustrates a conceptual diagram of the IHS assembled from a LWS chassis and functional compute components protected by a invertable chassis cover, according to one embodiment.

FIG. 2 illustrates an example IHS 200 having one more LWS chassis 202 each having a chassis base 204 having structural configuration that enables placement of the LWS chassis 202 in a nested, stacked configuration 206. The LWS chassis 202 can be shipped economically in a reduced volume and in a more mutually protective arrangement. For example, the LWS chassis 102 can be positioned in the stacked configuration 206 with a second LWS chassis 202 placed atop the LWS chassis 202 and a third LWS chassis 202 placed below the LWS chassis 202, wherein multiple LWS chassis 202 can be stacked in a vertical space whose height is less than a sum of individual heights of each of the multiple LWS chassis 202.

In one embodiment, a LWS chassis assembly 203 includes the LWS chassis 202 and a chassis cover 208 that can have edges that are shaped in a first (non-inverted) position to form an enclosure 240 with the LWS chassis 202 to protect end user selectable compute components 214. The chassis cover 208 is shaped in a second (inverted) position that is flipped over from the first position to be positioned in a casing 216 above the compute components 214. In the second position, a contoured shape 256 of a top panel 234 of the chassis cover 208 and the casing 216 opposingly contact an inserted modular, functional compute component 214 to retain the inserted modular, functional compute component 214 to prevent dislodging of the compute component 214 if the casing 216 is impacted. In the first position, the contoured shape 256 of the chassis cover 208 defines an air flow passage 258 around the user selected compute components 214 inserted into the chassis base 204.

In one or more embodiments, a chassis cover can both be selectively shipped in a nested, stacked configuration or be individually flipped and inserted into casing along with compute components. In other embodiments, the chassis cover is configured to be only shipped in a nested, stack or is configured to be only shipped individually in casing.

In one embodiment, the LWS chassis 202 can be formed from biodegradable material. Alternatively or in addition, the LWS chassis 202 can be made from or incorporate shielding material for shielding a user from electromagnetic interference (EMI) generated by the modular, functional compute components 214 and for shielding the modular functional computer components 214 from electrostatic damage. For clarity, the LWS chassis 202 is received within a bay 242 of the rack 220 defined and supported by a shelf 244. In other embodiments, internal lateral sides 246, 248 of the rack and external lateral sides 250, 252 of the LWS chassis 202 include engagement features 254 for mounting. The LWS chassis 202 can have an engagement feature, such as upwardly projecting pins 256 that are received by the LWS cover 208 in either an inverted or noninverted position.

Figure 3:
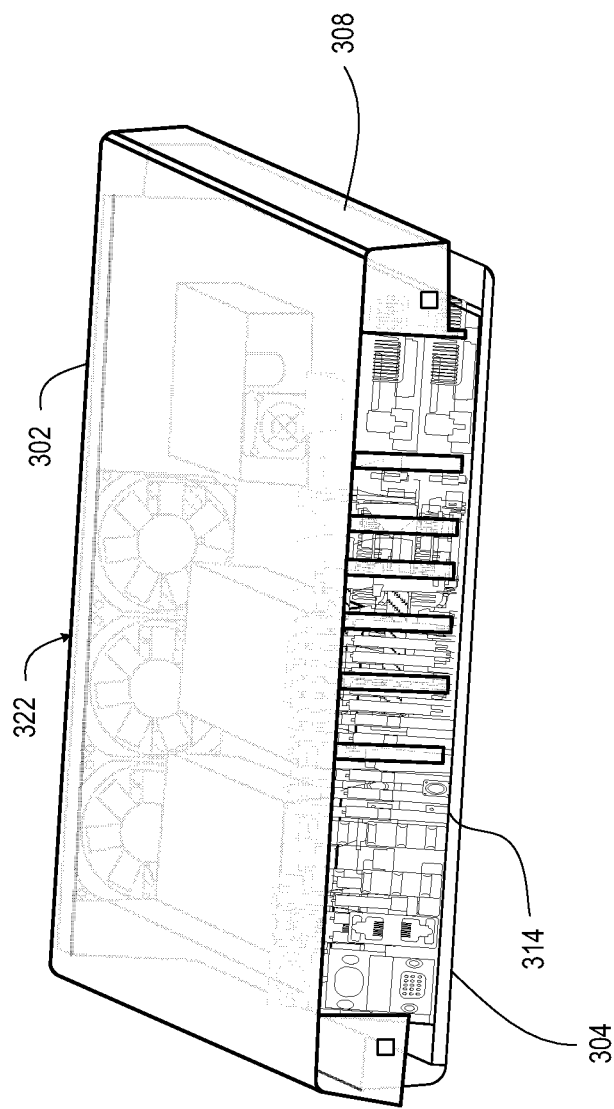
FIG. 3 illustrates a rear isometric view of an example rack-mountable server assembled with a LWS chassis and invertible chassis cover, according to one embodiment.
Figure 4:
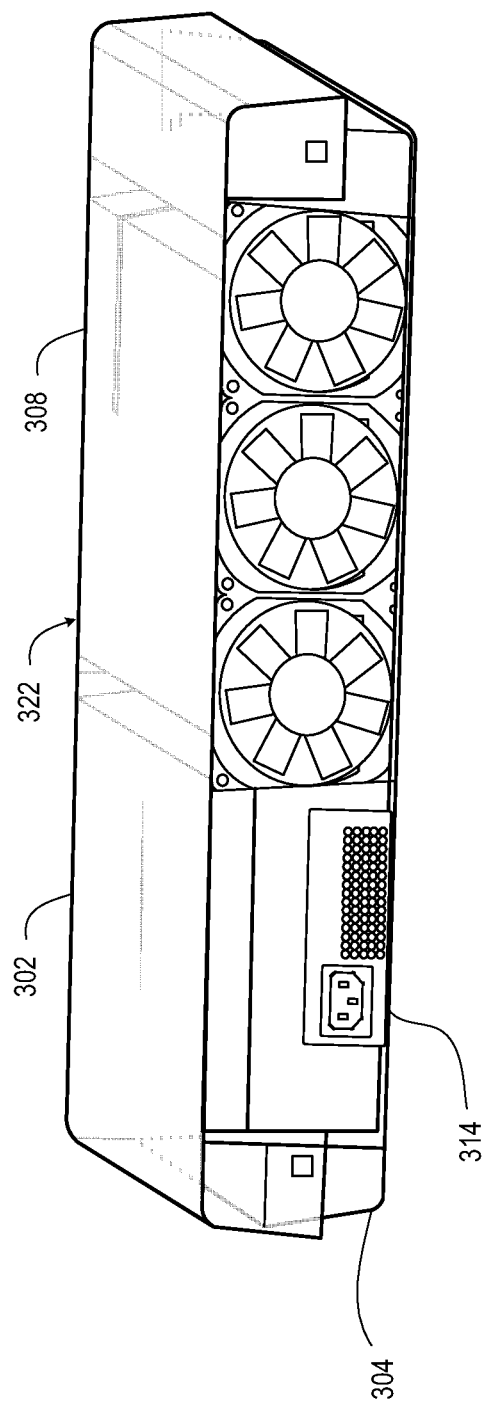
FIG. 4 illustrates a rear isometric view of the rack-mountable server of FIG. 3, according to one embodiment.

FIGS. 3-4 illustrate an example rack-mountable server 322 for an IHS 100 (FIG. 1) that has a LWS chassis 302 including a chassis base 304 containing compute components 314 with a chassis cover 308. A base panel 326 of the chassis base 304 can include slots 330 for engageably receiving compute components 314. In one embodiment, FIG. 3 is a rear isometric view of an example rack-mountable server 322. FIG. 4 is a rear isometric view of the rack-mountable server 322.

Figure 5:
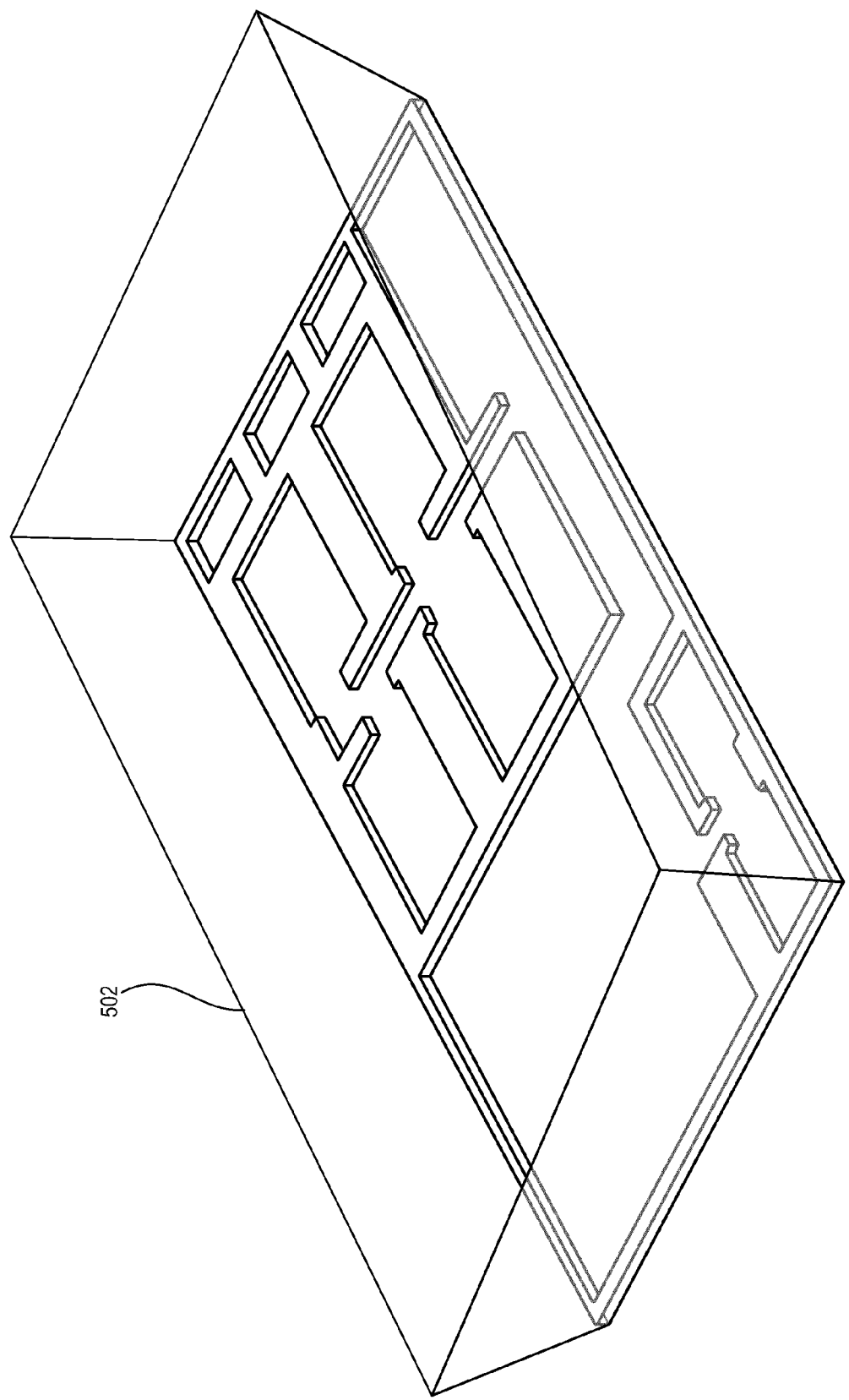
FIG. 5 illustrates an isometric view of an example LWS chassis, according to one embodiment.
Figure 6:
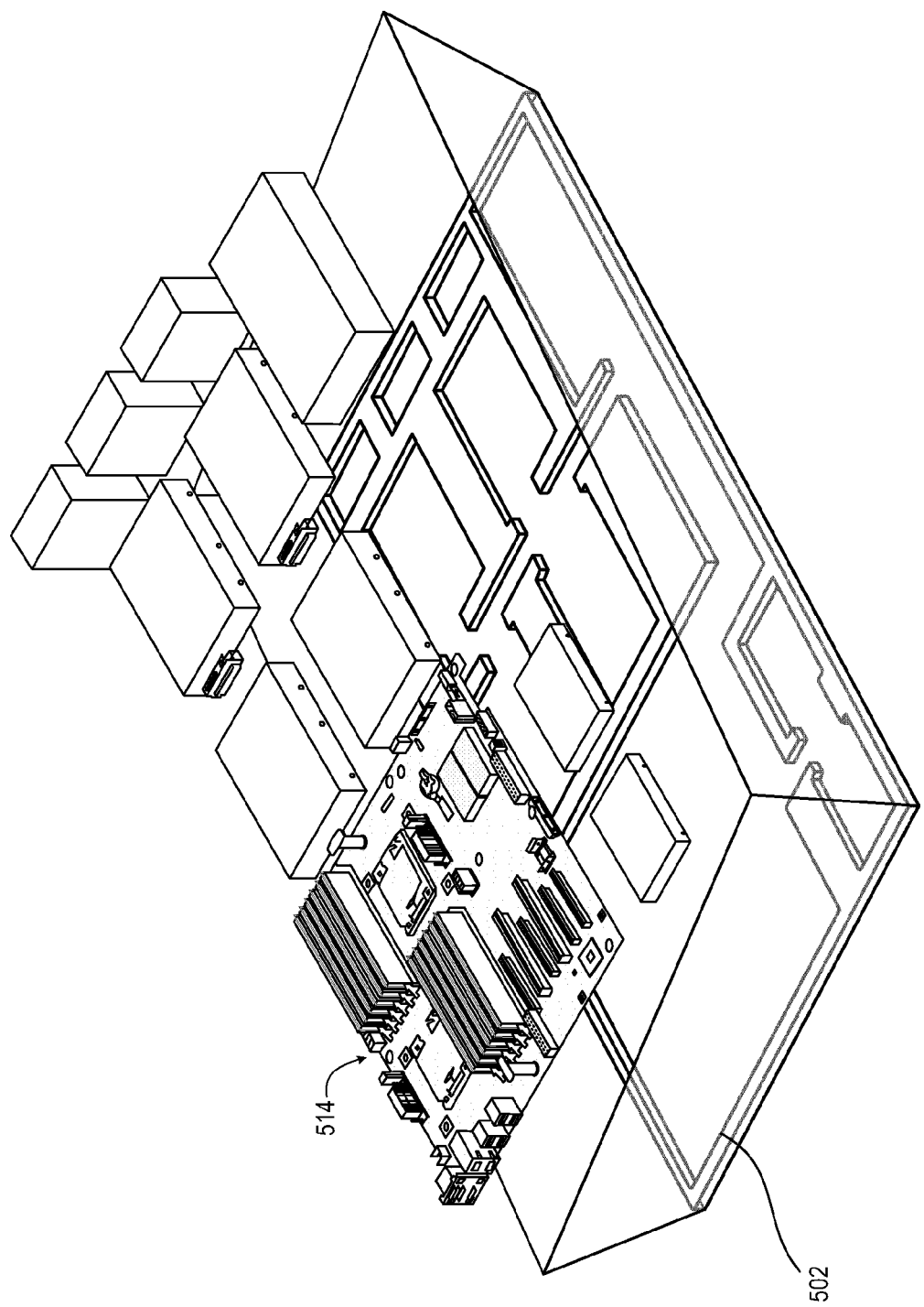
FIG. 6 illustrates an isometric view of the LWS chassis of FIG. 5 with an exploded view of modular, functional compute components that are inserted thereon, according to one embodiment.
Figure 7:
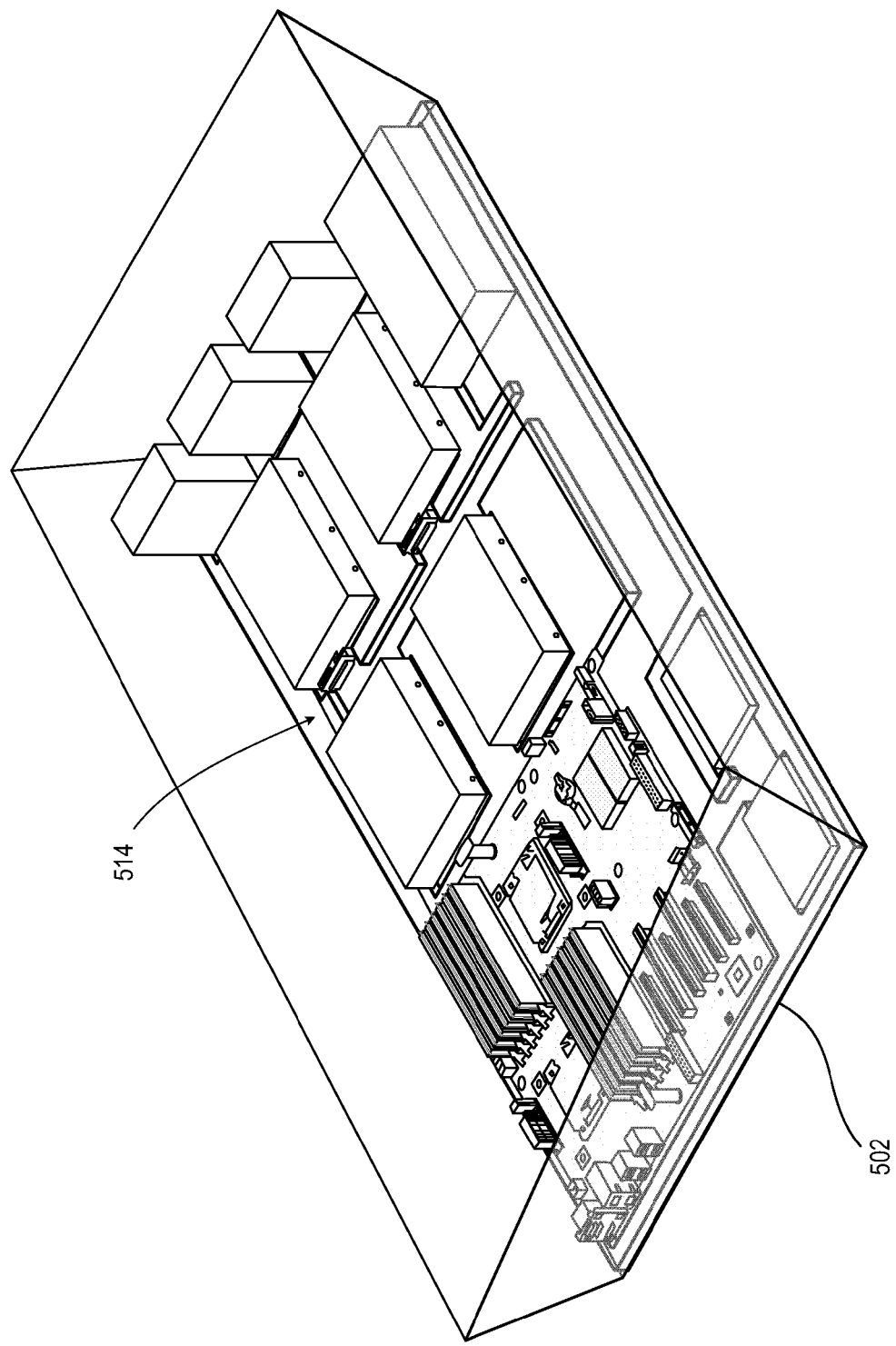
FIG. 7 illustrates an isometric view of the modular, functional compute components engageably received by the LWS chassis of FIG. 5, according to one embodiment.
Figure 8:
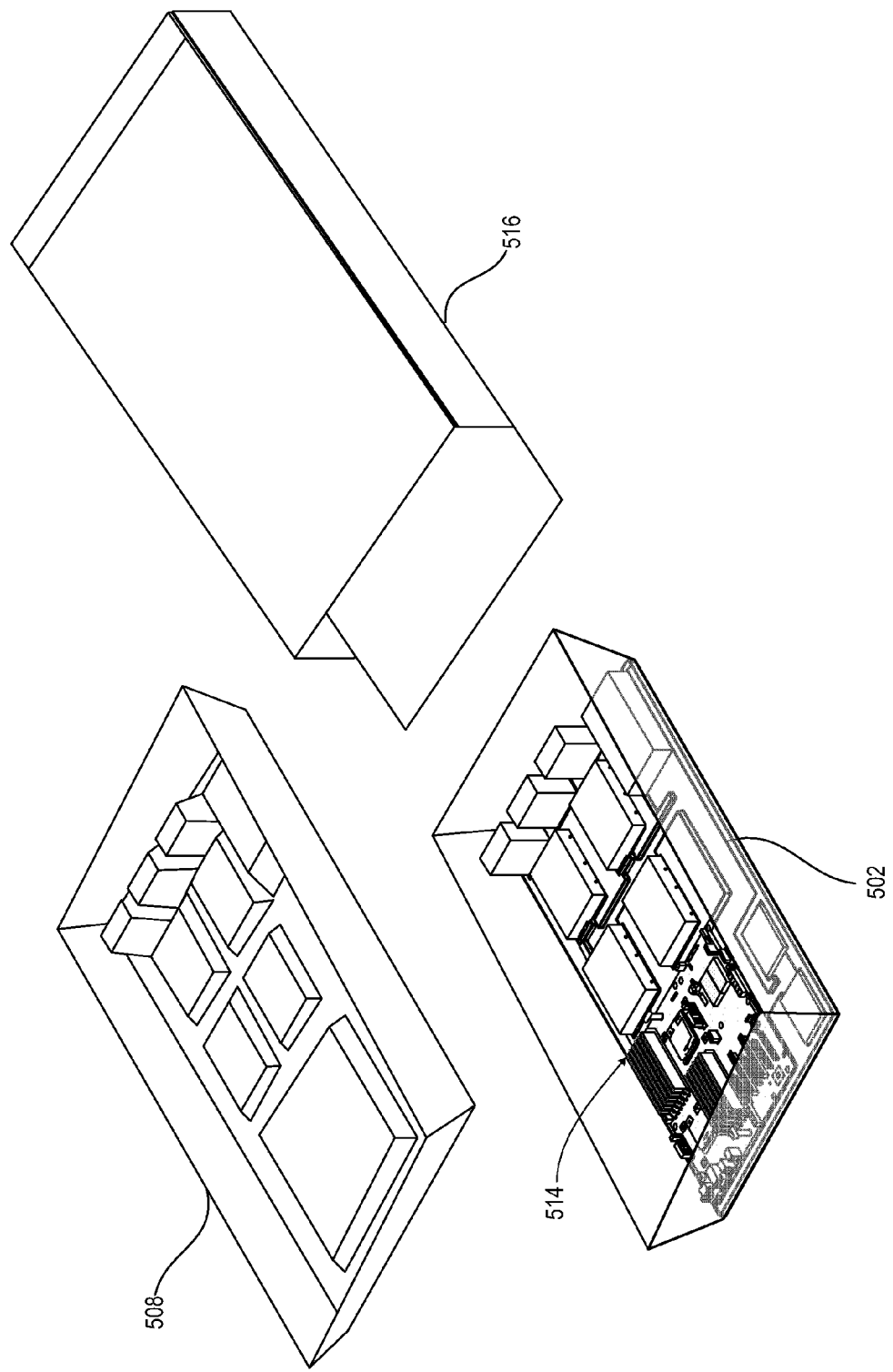
FIG. 8 illustrates an isometric view of the assembled compute components, LWS chassis, invertible chassis cover, and a partially assembled multi-purpose, protection and support and shipping (PSS) casing, according to one embodiment.
Figure 9:
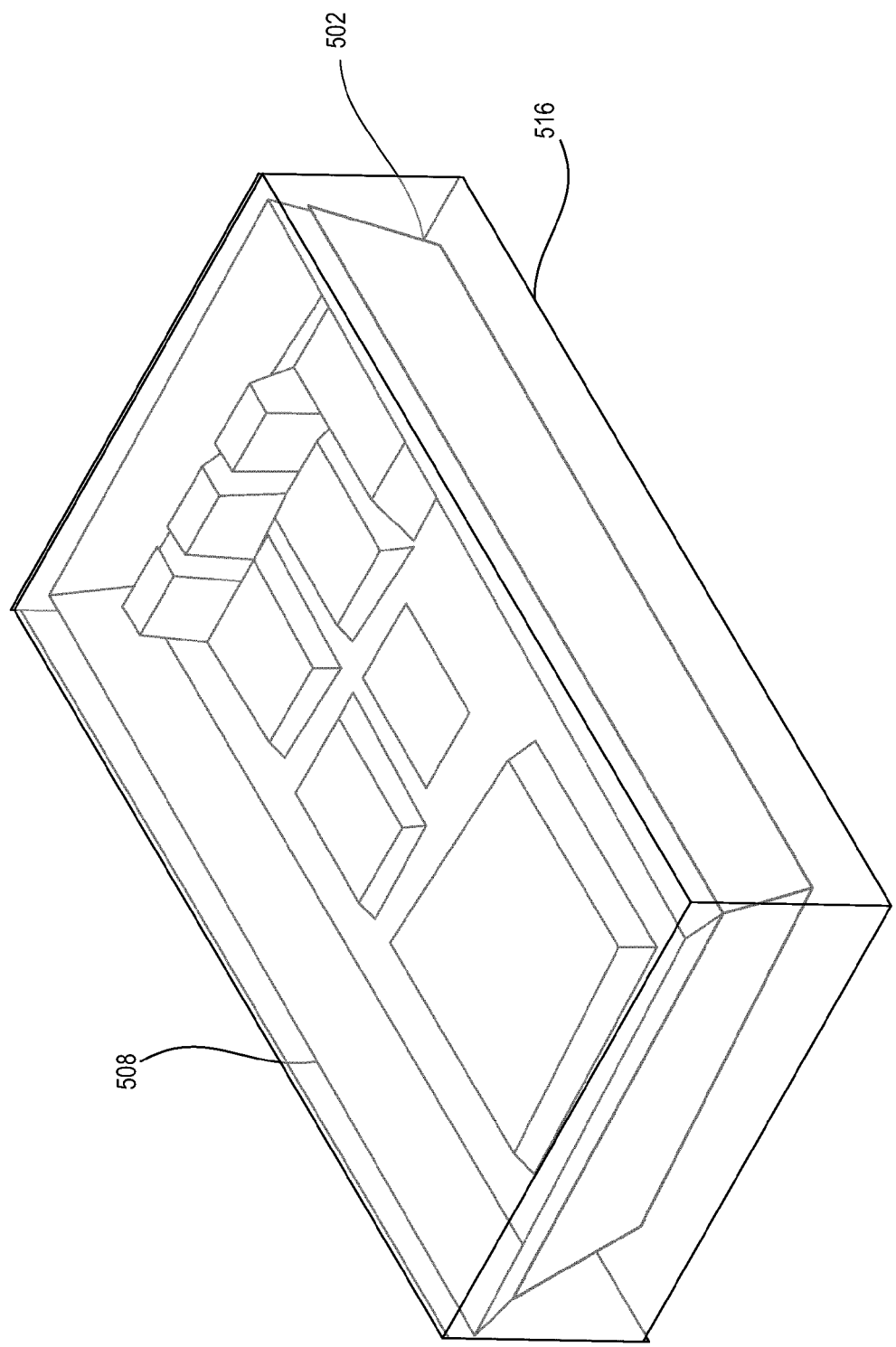
FIG. 9 illustrates an isometric view of the assembled compute components, LWS chassis, and inverted chassis cover inserted into the PSS casing of FIG. 8, according to one embodiment.

FIG. 5 illustrates an example LWS chassis 502, according to one embodiment. FIG. 6 illustrates an isometric view of the LWS chassis 502 with an exploded view of modular, functional compute components 514 that are inserted thereon, according to one embodiment. FIG. 7 illustrates an isometric view of the modular, functional compute components 514 engageably received by the LWS chassis 502 of FIG. 5, according to one embodiment. FIG. 8 illustrates the assembled compute components 514, LWS chassis 502, invertable chassis cover 508, and a partially assembled multi-purpose, protection and support and shipping (PSS) casing 516, according to one embodiment. FIG. 9 illustrates the LWS chassis 502 covering the assembled compute components 514 (FIG. 8) and enclosing the inverted chassis cover 508 inserted into the partially assembled multi-purpose, protection and support and shipping (PSS) casing 516, according to one embodiment. The inverted chassis cover 508 is installed in the "shipping position" where the inverted chassis cover 508 secures the assembled compute components 514 (FIG. 8) during shipping. At a customer end destination, the chassis cover 508 then can be rotated 180 degrees to a noninverted or "operational position".

Figure 10:
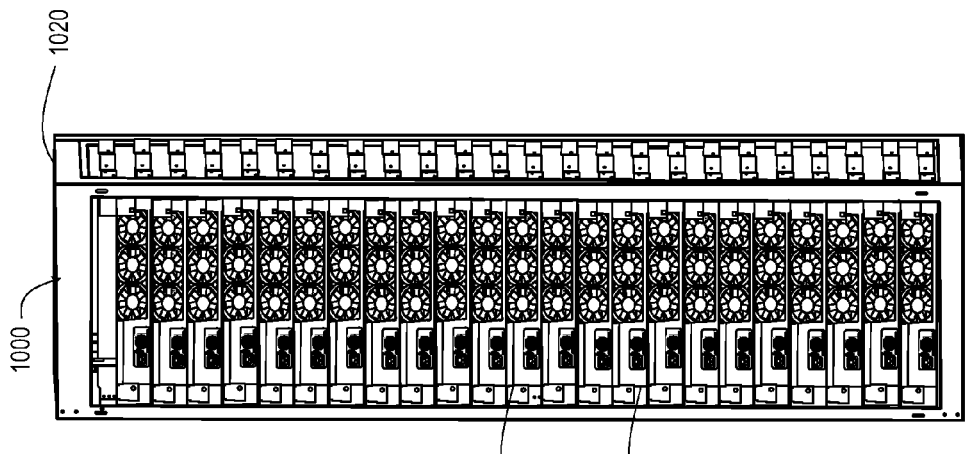
FIG. 10 illustrates a front side view of rack servers of FIG. 3 mounted in a rack, according to one embodiment.
Figure 11:
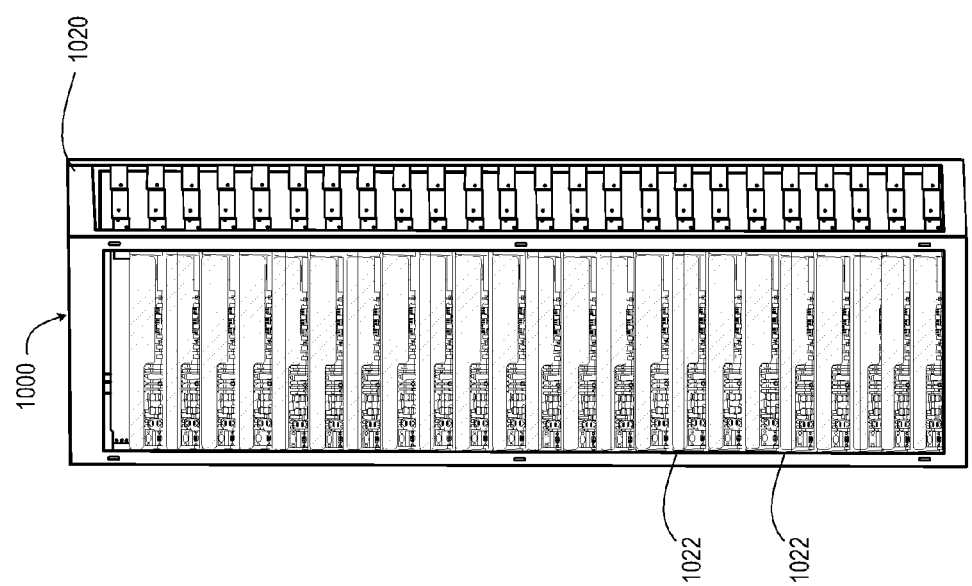
FIG. 11 illustrates a rear side view of the IHS of FIG. 10, according to one embodiment.

FIGS. 10-11 illustrate an example IHS 1000 having a rack frame 1020 in which are mounted a plurality of the example rack servers 1022 In particular, FIG. 10 illustrates a front side view of an IHS 1000 comprised of rack servers 1022 mounted in a rack frame 1020. FIG. 11 illustrates a rear side view of the IHS 1000.

Figure 12:
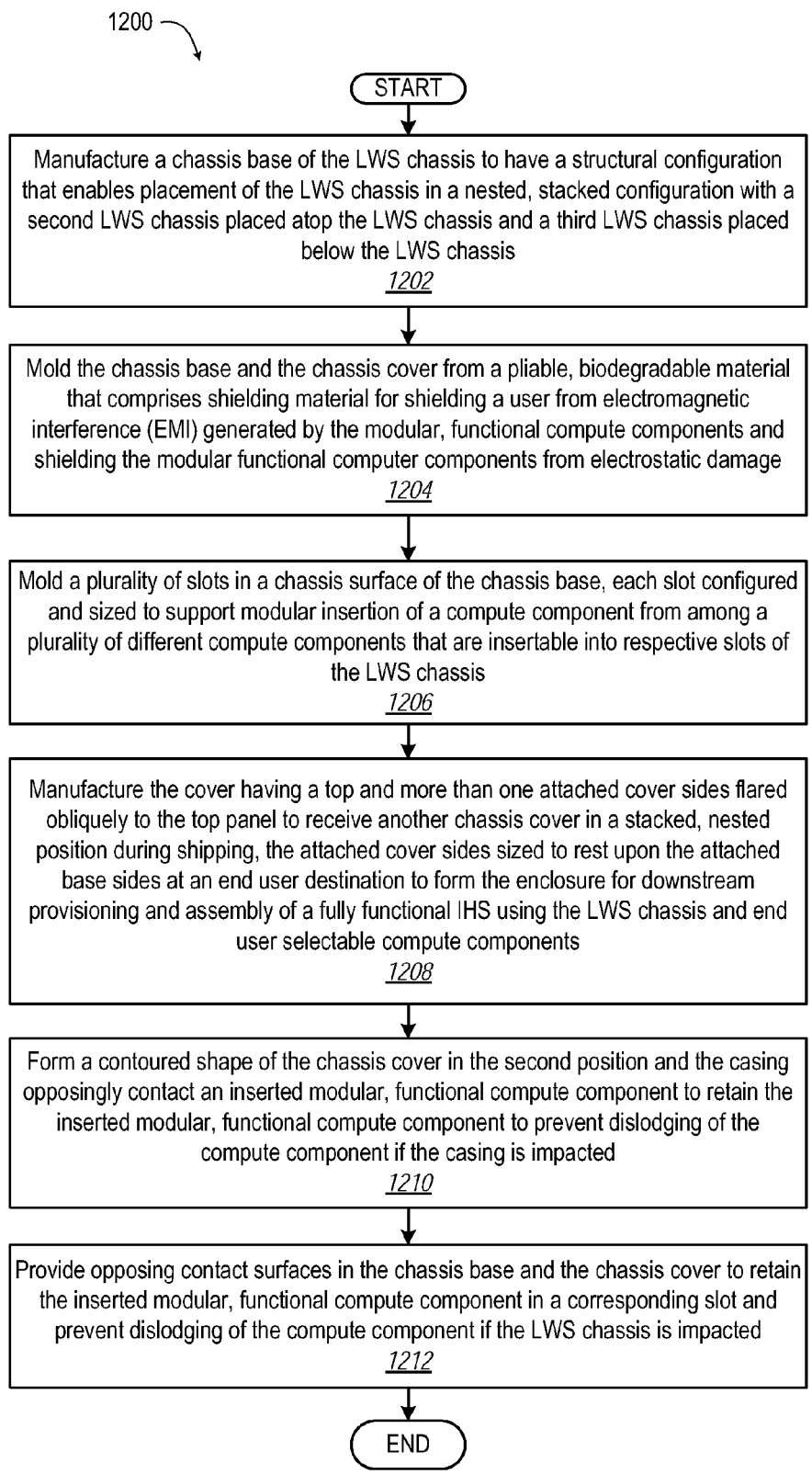
FIG. 12 illustrates a flow diagram of a method of provisioning an IHS with an LWS chassis that ships in a reduced volume, according to one embodiment.

FIG. 12 illustrates a method 1200 of structurally protecting an IHS with an LWS chassis that ships in a reduced volume. The method 1200 includes manufacturing a chassis base of the LWS chassis to have a structural configuration that enables placement of the LWS chassis in a nested, stacked configuration with a second LWS chassis placed atop the LWS chassis and a third LWS chassis placed below the LWS chassis (block 1202). Multiple LWS chassis can be stacked in a vertical space whose height is less than a sum of individual heights of each of the multiple LWS chassis. Compute components are insertable into the LWS chassis for downstream provisioning and assembly of a fully functional IHS using the LWS chassis and end user selectable compute components. The compute components can be packaged in a rectoid casing for shipping to an end user destination for the assembly with the nested, stacked LWS chassis shipped to the same end user destination.

In one embodiment as either a separate fabrication step or as a single manufacturing procedure, the method 1200 includes manufacturing a chassis by molding the chassis base and the chassis cover from a pliable, biodegradable material that comprises shielding material for shielding a user from electromagnetic interference (EMI) generated by the modular, functional compute components and shielding the modular functional computer components from electrostatic damage (block 1204).

Either as an integral aspect to forming the chassis or as a separate fabrication step, the method 1200 further includes molding a plurality of slots in a chassis surface of the chassis base, each slot configured and sized to support modular insertion of a compute component from among a plurality of different compute components that are insertable into respective slots of the LWS chassis (block 1206).

Either as a separate attachment or integral aspect to molding, the method 1200 further includes manufacturing the cover having a top and more than one attached cover sides flared obliquely to the top panel to receive another chassis cover in a stacked, nested position during shipping, the attached cover sides sized to rest upon the attached base sides at an end user destination to form the enclosure for downstream provisioning and assembly of a fully functional IHS using the LWS chassis and end user selectable compute components (block 1208). As an alternative to or as an additional feature of a chassis cover configured for a nested, stacked configuration, the method 1200 can further include an integral molding step or separate fabrication step to form a contoured shape of the chassis cover in the second position and the casing opposingly contact an inserted modular, functional compute component to retain the inserted modular, functional compute component to prevent dislodging of the compute component if the casing is impacted (block 1210). The contoured shape of the chassis cover in the first position defines an air flow passage around the user selected compute components inserted into the chassis base.

In one embodiment as a separate attachment step or integral to molding, the method 1200 includes providing opposing contact surfaces in the chassis base and the chassis cover to retain the inserted modular, functional compute component in a corresponding slot and prevent dislodging of the compute component if the LWS chassis is impacted (block 1212).

Figure 13:
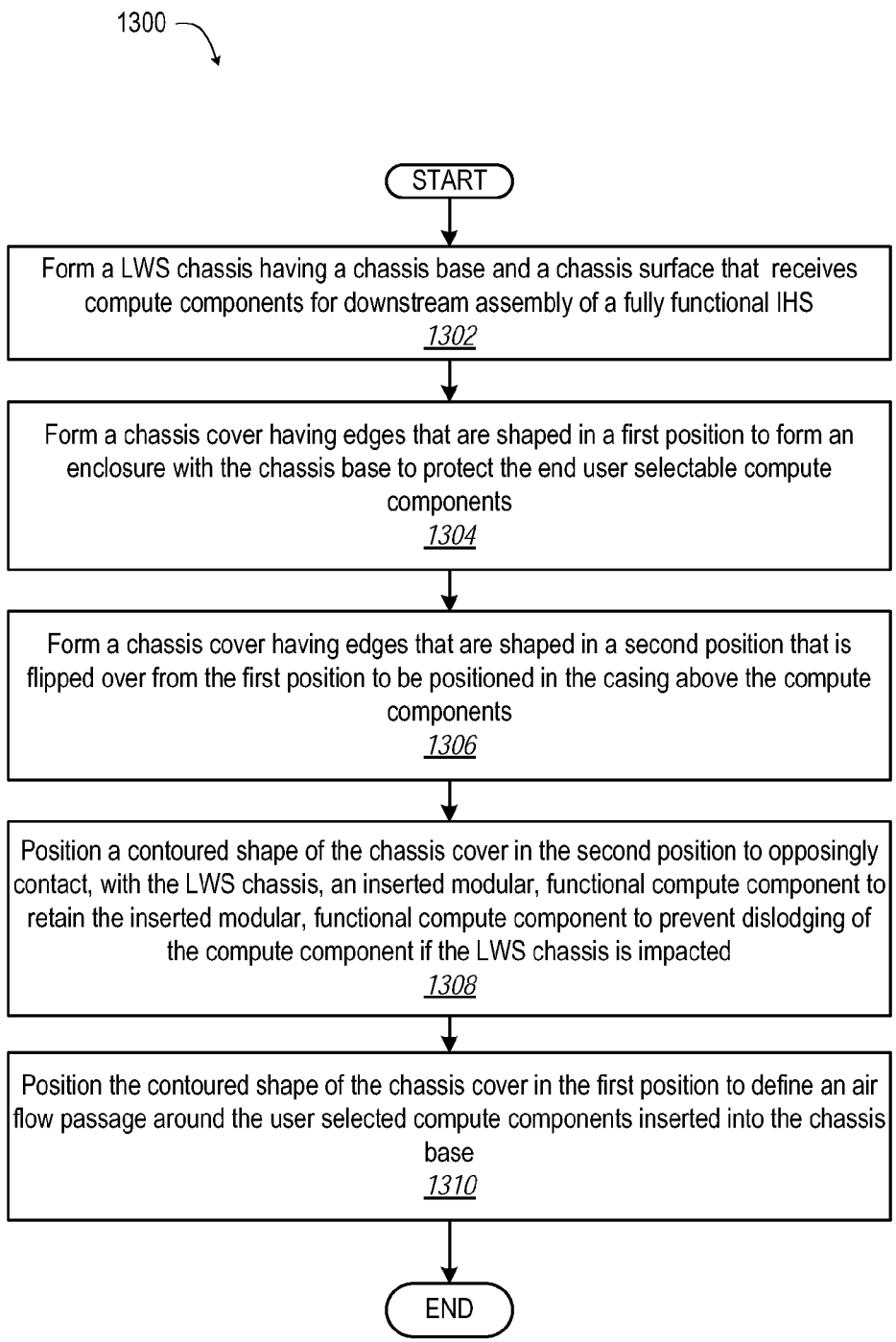
FIG. 13 illustrates a flow diagram of a method of provisioning an IHS with a chassis cover that is invertible during shipping, according to one embodiment.

FIG. 13 illustrates an example method for shipping and downstream assembly of an IHS. In one embodiment, the method 1300 includes forming a LWS chassis having a chassis base and a chassis surface that receives compute components for downstream assembly of a fully functional IHS (block 1302). The method 1300 includes forming a chassis cover having edges that are shaped in a first position to form an enclosure with the chassis base to protect the end user selectable compute components (block 1304). The method includes forming a chassis cover having edges that are shaped in a second position that is flipped over from the first position to be positioned in the casing above the compute components (block 1306). The method 1300 includes positioning a contoured shape of the chassis cover in the second position to opposingly contact, with the LWS chassis, an inserted modular, functional compute component to retain the inserted modular, functional compute component to prevent dislodging of the compute component if the LWS chassis is impacted (block 1308). The method 1300 includes positioning the contoured shape of the chassis cover in the first position to define an air flow passage around the user selected compute components inserted into the chassis base (block 1310).

In the above described flow charts of FIGS. 12-13, one or more of the methods may be embodied in an automated manufacturing system that performs a series of functional processes. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. An information handling system (IHS) comprising:
   a lightweight server (LWS) chassis that is user selectable from multiple LWS chassis, each of the multiple LWS chassis comprising a chassis base having structural configuration that enables placement of the LWS chassis in a nested, stacked configuration with a second LWS chassis placed atop the LWS chassis and a third LWS chassis placed below the LWS chassis, wherein the multiple LWS chassis can be stacked in a vertical space with a height that is less than a sum of individual heights of each of the multiple LWS chassis;
   at least two compute components inserted into the LWS chassis; and
   one or more connecting cablings interconnecting the at least two compute components.

2. The IHS of claim 1, wherein the chassis base is molded from a pliable material, each chassis base further comprises:
   a base panel having a top surface that includes a plurality of slots each formed as a molded receptacle within the top surface, each slot configured and sized to support modular insertion of a compute component from among a plurality of different compute components that are insertable into respective slots of the LWS chassis for downstream provisioning and assembly of a fully functional information handling system (IHS) using the LWS chassis and end user selectable compute components.

3. The IHS of claim 1, further comprising:
   compute components that are insertable into the LWS chassis for downstream provisioning and assembly of a fully functional information handling system (IHS) using the LWS chassis and end user selectable compute components are packaged in a rectoid casing; and
   a chassis cover having edges that are shaped in a first position to form an enclosure with the chassis base to protect the end user selectable compute components and that is shaped in a second position that is flipped over from the first position to be positioned in the casing above the compute components;
   wherein a contoured shape of the chassis cover in the second position and the casing opposingly contact an inserted modular, functional compute component to retain the inserted modular, functional compute component to prevent dislodging of the compute component if the casing is impacted, and
   wherein the contoured shape of the chassis cover in the first position defines an air flow passage around the user selected compute components inserted into the chassis base.

4. The IHS of claim 1, wherein the LWS chassis further comprises: bio-degradable shielding material for shielding a user from electromagnetic interference (EMI) generated by the modular, functional compute components and for shielding the modular functional computer components from electrostatic damage; and rack engagement features for the LWS chassis to be mounted within a rack.

5. The IHS of claim 1, further comprising a chassis cover having a top panel and at least one attached cover side flared obliquely to the top panel to receive another chassis cover in a stacked, nested position during shipping, and which includes one or more connection affordance to enable the chassis cover to connect to the chassis base to form an enclosure for downstream provisioning and assembly of a fully functional information handling system (IHS) using the LWS chassis and end user selectable compute components.

6. The IHS of claim 5, wherein the chassis base further comprises at least one base side extending upwards from the base panel and which is flared obliquely to the base panel that enables insertion of another chassis base in a stacked, nested position during shipping, wherein the attached cover sides encompass at least a portion of the attached base sides to rest upon the attached base sides to form the enclosure.

* * * * *